United States Patent
Luvara et al.

(10) Patent No.: US 6,310,303 B1
(45) Date of Patent: Oct. 30, 2001

(54) STRUCTURE FOR PRINTED CIRCUIT DESIGN

(76) Inventors: John J. Luvara, 2289 Bedford St., D14, Stamford, CT (US) 06905; John J. Quigley, Jr., 14 Celestial La., Wallingford, CT (US) 06492; Ray Prasad, 2240 SW. Gardenview Ave., Portland, OR (US) 97225

( * ) Notice: Subject to any disclaimer, the term of this patent is extended or adjusted under 35 U.S.C. 154(b) by 0 days.

(21) Appl. No.: 09/586,726

(22) Filed: Jun. 5, 2000

Related U.S. Application Data

(63) Continuation-in-part of application No. 09/037,903, filed on Mar. 10, 1998, now Pat. No. 6,121,679.

(51) Int. Cl.⁷ .............................. H01R 12/04; H05K 1/11
(52) U.S. Cl. ........................................... 174/261; 361/767
(58) Field of Search ..................... 174/260; 361/767, 361/783, 792, 768, 769, 770, 771, 793, 794, 795

(56) References Cited

U.S. PATENT DOCUMENTS

| | | | |
|---|---|---|---|
| 4,438,560 | 3/1984 | Kisters | 29/830 |
| 4,630,172 | 12/1986 | Stenerson et al. | 361/386 |
| 4,638,348 | 1/1987 | Brown et al. | 357/74 |
| 4,839,717 | 6/1989 | Phy et al. | 357/74 |
| 4,979,663 | 12/1990 | Sofia et al. | 228/180.2 |
| 5,046,953 | 9/1991 | Shreeve et al. | 439/66 |
| 5,173,767 | 12/1992 | Lange et al. | 257/664 |
| 5,177,863 | 1/1993 | Lam | 29/830 |
| 5,216,806 | 6/1993 | Lam | 29/848 |
| 5,222,014 | 6/1993 | Lin | 361/414 |
| 5,253,415 | 10/1993 | Dennis | 29/827 |
| 5,311,057 | 5/1994 | McShane | 257/676 |
| 5,378,859 | 1/1995 | Shirasaki et al. | 174/261 |
| 5,381,039 | 1/1995 | Morrison | 257/701 |
| 5,383,269 | 1/1995 | Rathmell et al. | 29/830 |
| 5,406,701 | 4/1995 | Pepe et al. | 29/840 |
| 5,412,247 | 5/1995 | Martin | 257/678 |
| 5,454,160 | 10/1995 | Nickel | 29/840 |
| 5,455,385 | 10/1995 | Newton et al. | 174/52.4 |
| 5,461,774 | 10/1995 | Holmes et al. | 29/840 |
| 5,473,814 | 12/1995 | White | 29/840 |
| 5,477,611 | 12/1995 | Sweis et al. | 29/840 |
| 5,477,933 | 12/1995 | Nguyen | 174/262 |
| 5,481,436 | 1/1996 | Werther | 361/284 |
| 5,490,040 | 2/1996 | Gaudenzi et al. | 361/773 |
| 5,490,324 | 2/1996 | Newman | 29/830 |
| 5,495,398 | 2/1996 | Takiar et al. | 361/790 |
| 5,541,367 | 7/1996 | Swamy | 174/260 |
| 5,557,502 | * 9/1996 | Banerjee et al. | 361/712 |
| 5,576,519 | 11/1996 | Swamy | 174/265 |
| 5,615,477 | 4/1997 | Sweitzer | 29/840 |
| 5,616,520 | 4/1997 | Nishiuma et al. | 438/125 |
| 5,625,944 | 5/1997 | Werther | 29/843 |
| 5,641,946 | 6/1997 | Shim | 174/261 |
| 5,647,122 | 7/1997 | Launay et al. | 29/840 |
| 5,654,243 | 8/1997 | Yoneda et al. | 29/840 |
| 5,672,909 | 9/1997 | Glenn et al. | 257/668 |
| 5,706,178 | 1/1998 | Barrow | 361/777 |
| 5,714,800 | 2/1998 | Thompson | 257/690 |
| 6,006,428 | * 12/1999 | Feilchenfeld et al. | 29/852 |
| 6,046,909 | * 4/2000 | Joy | 361/748 |
| 6,094,354 | * 7/2000 | Nakajoh et al. | 361/760 |

* cited by examiner

*Primary Examiner*—Jeffrey Gaffin
*Assistant Examiner*—Jeremy Norris
(74) *Attorney, Agent, or Firm*—Bachman & Lapointe, P.C.

(57) ABSTRACT

A substrate structure for surface mount devices, including a plurality of substrate layers including at least a base layer and an outer layer; the base layer having a contact surface and a first array of conductive elements on the contact surface; the outer layer having a contact surface, a second array of conductive elements on the contact surface, and at least one access passing through the outer layer and the outer layer being mounted to the base layer with the access positioned over the first array, wherein the first array and the second array define in combination a device mounting site.

33 Claims, 13 Drawing Sheets

STRUCTURE FOR PRINTED CIRCUIT DESIGN

CROSS REFERENCE TO RELATED APPLICATION

This application is a continuation-in-part of U.S. patent application Ser. No. 09/037,903, filed Mar. 10, 1998 now U.S. Pat. No. 6,121,679.

BACKGROUND OF THE INVENTION

The invention relates to a structure for printed circuit design and, more specifically to a substrate structure for surface mounted components or devices which eliminates or substantially reduces the need for vias directly beneath the surface mounting site.

Array surface mounted devices such as ball grid array packages (BGAs, PBGAs, CBGAs, TBGAs, etc.), chip scale packages (CSPs), and direct chip attach (flip chips) are being used to achieve better performance in system miniaturization. However, these types of devices have large numbers of contacts or balls for contacting conductive pads of a substrate, and each pad must be routed for interconnection with various components and test point vias. As shown in FIG. 1, this routing adds to the layer count of the substrate, and further requires a potentially large number of vias underneath the package.

This conventional routing and via configuration adds to manufacturing costs, and further provides for additional connections which are subject to potential failure such as during the manufacturing process.

The need remains for a cost-effective and reliable method for connecting array surface mounted devices to substrates.

It is therefore the primary object of the present invention to provide a substrate structure for mounting array surface mounted devices wherein vias directly beneath the device are reduced or eliminated.

It is a further object of the present invention to provide a substrate structure for surface mounting such devices which results in a reduction in the number of layers as compared to conventional dielectric substrate constructions.

It is still another object of the present invention to provide a substrate structure as described above which is less expensive and more reliable.

It is a still further object of the present invention to provide a substrate structure having improved solder joint reliability.

It is another object of the present invention to provide a substrate structure wherein single substrate layers can be defined as ground planes, voltage planes and the like.

Other objects and advantages of the present invention will appear hereinbelow.

SUMMARY OF THE INVENTION

In accordance with the present invention, the foregoing objects and advantages have been readily attained.

In accordance with the invention, a substrate structure is provided which uses a plurality of dielectric layers having at least one dielectric layer positioned over a base layer or PCB to form a substrate structure wherein each layer has a cutout increasing in size away from the base layer. This defines a mounting site wherein a portion of pads are located on each layer, and a portion on the base layer, with corresponding traces provided on the respective layer. In this manner, a mounting site may be provided with routing for a large number of pads which eliminates or at least substantially reduces the need for vias underneath the package or device mounting site.

In accordance with a particular embodiment of the present invention, instead of an entire cutout, intermediate and outer layers are provided with access holes positioned over pads or conductive elements of underlying layers. This is particularly advantageous by providing additional surface area on each layer which can be used for printing traces and the like.

In accordance with still another particular embodiment of the present invention, a matching number of holes is provided on each layer with corresponding conductive pads positioned on the base layer and conductive elements positioned in desired patterns on intermediate and outer layers. In this embodiment, solder balls are used to secure a device to the site, and when the solder balls melt, there will be contact to any intermediate and outer layers as well as solder ball pads on the base layer by extending through the clearance hole vias on each layer, the solder connections include increased height solder ball joints, forming a pillar inside the clearance hole vias, which increases the reliability of the solder joints. In this embodiment, in addition to reducing board layer count and board costs as discussed earlier, an added benefit is provided based upon improved solder joint reliability.

According to the invention, a substrate structure for surface mount devices is provided which substrate structure comprises: a plurality of substrate layers including at least a base layer and an outer layer; said base layer having a contact surface and a first array of conductive elements on said contact surface; said outer layer having a contact surface, a second array of conductive elements on said contact surface, and at least one access passing through said outer layer; and said outer layer being mounted to said base layer with said access positioned over said first array, wherein said first array and said second array define in combination a device mounting site.

In accordance with an additional embodiment of the present invention, a substrate structure for surface mount devices is provided, which substrate structure comprises: a base layer having a contact surface and a first array of conductive elements on said contact surface; and at least one additional layer each having a contact surface, access and a further array of conductive elements on said contact surface, said at least one additional layer being positioned substantially adjacent to said base layer such that said first array and said further array of each additional layer define in combination a package mounting site.

In accordance with still another aspect of the present invention, a printed circuit structure is provided, which structure comprises: a surface mount device having a mounting surface and a plurality of conductive members disposed on said mounting surface; and a substrate structure for mounting said package, comprising a plurality of substrate layers including at least a base layer and an outer layer; said base layer having a contact surface and a first array of conductive elements on said contact surface; said outer layer having a contact surface, an access and a second array of conductive pads on said contact surface; and said outer layer being mounted to said base layer with said cutout positioned over said first array, said first array and said second array defining in combination a package mounting site; said surface mount device being connected to said mounting site with said conductive members connected to said first array and said second array.

The routing architecture and substrate structure of the present invention may suitably be used to provide mounting sites for packages or devices on either the primary or secondary side of the printed circuit structure or PCB, or on both sides, as desired.

BRIEF DESCRIPTION OF THE DRAWINGS

A detailed description of preferred embodiments of the present invention follows, with reference to the attached drawings wherein.

DETAILED DESCRIPTION

In accordance with the present invention, a substrate structure is provided for mounting array surface mounted devices which reduces or eliminates the need for vias directly beneath the package or device and which further can reduce the total layer count required in the substrate structure.

In further accordance with additional embodiments of a present invention, a substrate structure is provided which can advantageously allow for defining of a single substrate layer or plane for ground, voltage and the like, and this structure further provides for enhancing the joint integrity of the mount of a device to the substrate, all as will be discussed below.

Figure 1:
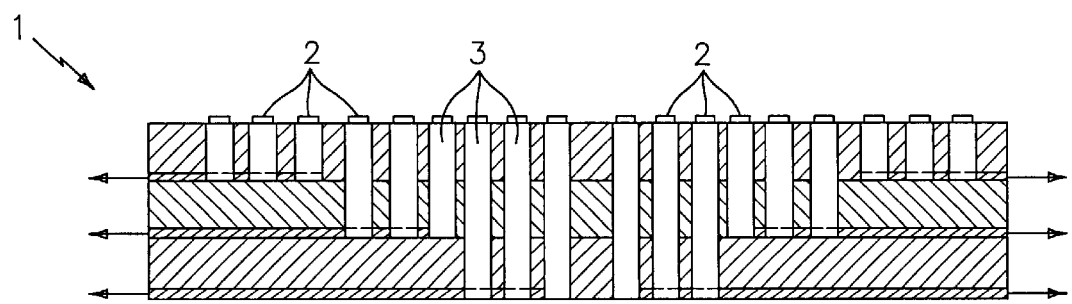
FIG. 1 is a side sectional view with exaggerated layer thickness of a prior art substrate structure.

FIG. 1 illustrates a prior art substrate structure 1 having a number of pads 2 which are adapted for contact with conductive solder balls of an array surface mounted package. As will be further described below, each pad 2 is preferred to be connected to other components as well as test point vias. These interconnections are typically made using traces which are etched or otherwise positioned along layers of the substrate structure. Pads 2 are typically positioned to correspond to solder balls of a BGA chip or other structure. These solder balls are typically positioned at a pitch or spacing of 6–60 mils depending upon the type of device. For example, BGA devices typically have a pitch of 40–60 mils, chip scale packages (CSP's) typically have a pitch of 10–40 mils, and flip chips may typically have a pitch of 6–12 mils. The traces for inner pads, as is readily apparent, must pass through gaps between pads of the outermost row of pads on each layer of the substrate structure. Allowing for sufficient space between each trace, and at a commonly used BGA pitch of 50 mils, a reasonable maximum of two traces can pass between each pair of pads. It should readily be apparent that traces for only a limited number of pads, for example the second and third innermost row of pads, can pass between each pad of the outermost row. Further, regardless of improvements providing for smaller pitch, a limitation will no doubt remain as to the number of traces which can be etched between two pads.

Figure 1A:
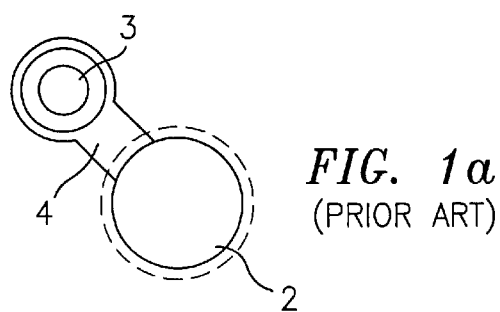
FIG. 1a further illustrates a top view of the prior art structure of FIG. 1.

As shown in FIG. 1, this problem is currently addressed by providing additional layers beneath the top layer, and vias 3 adjacent and connected to pads 2 which lead to different layers from inner pads 2 so that additional traces can be positioned along different layers. FIG. 1a shows how pads 2 are conventionally connected, through connectors 4, to vias 3. This structure is not illustrated in FIG. 1 for the sake of simplicity. As set forth above, although this addresses the specific problem of interconnection of each pad 2, the additional vias 3 add an additional element which may be subject to failure, thereby lessening reliability, and the layer count and cost of the substrate is also increased. Further, buried vias and other fabrication difficulties are also common and may lead to reduced reliability.

Figure 2:
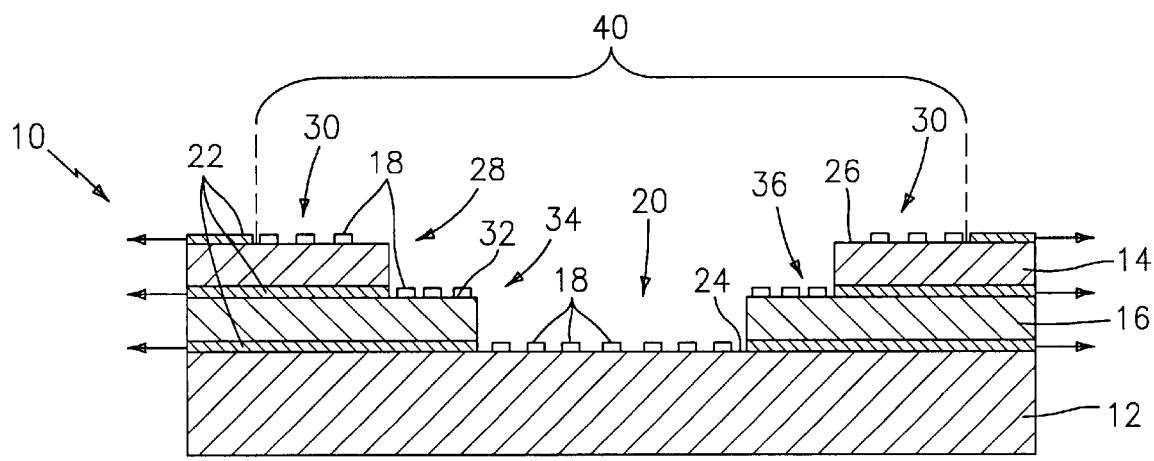
FIG. 2 is a side sectional view of a substrate structure in accordance with the present invention having exaggerated layer thickness.
Figure 6A:
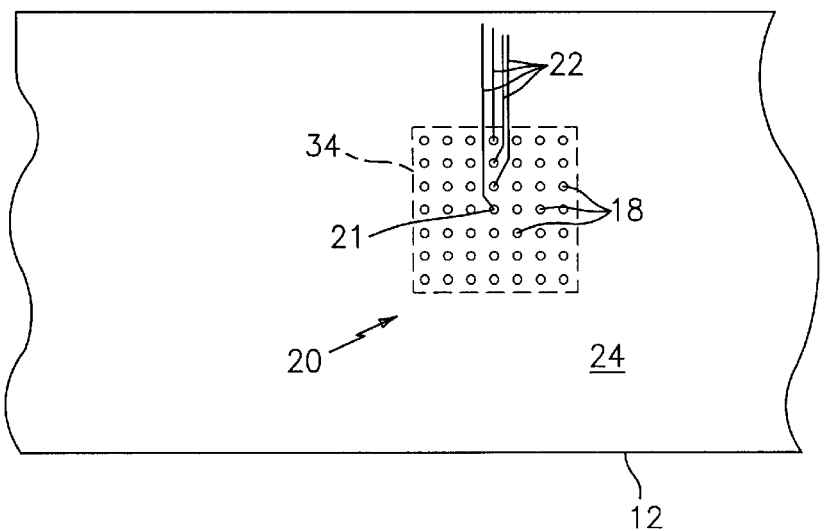
FIGS. 6a–6c are top views of layers of a substrate structure in accordance with the present invention.
Figure 6B:
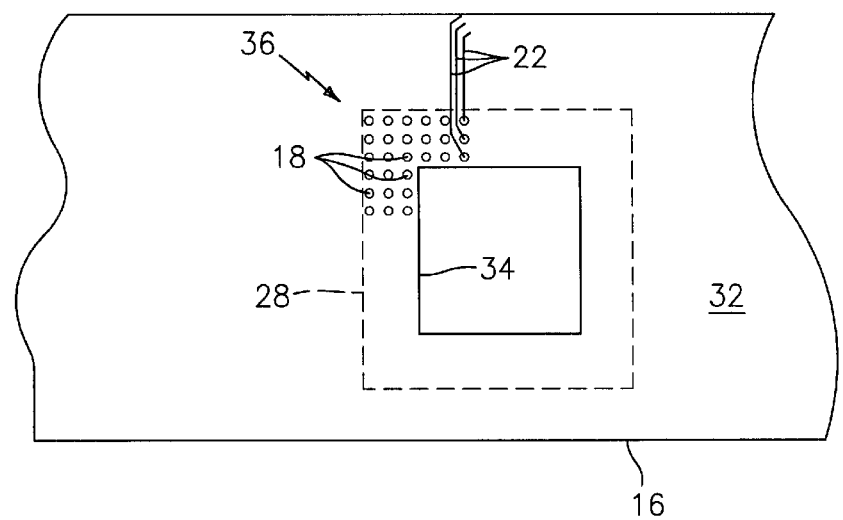
Figure 6C:
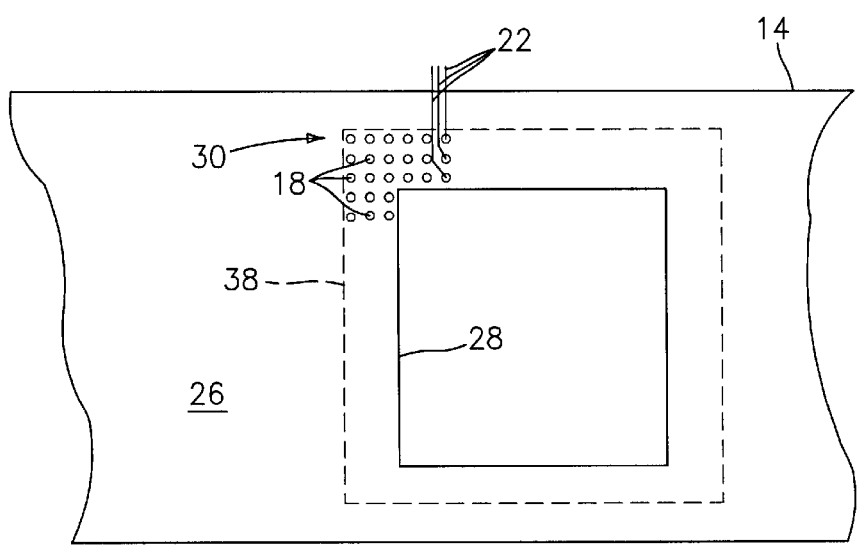

Referring to FIG. 2, a substrate structure is illustrated in accordance with the present invention and overcoming the problems in connection with the prior art substrate structure of FIGS. 1 and 1a. As shown in FIG. 2, a substrate structure 10 in accordance with the present invention is preferably provided having at least a base or bottom layer or core 12 and a top or outer layer 14, and preferably at least one intermediate layer 16. Layers 12, 14 and 16 are shown in FIG. 2 having an exaggerated thickness which will assist in understanding of the present invention. However, as discussed below, layers 14, 16 are preferably very thin layers of dielectric material such that the difference in height of pads on different layers does not interfere with good connection with a device. As shown, layers 14, 16 are provided having access areas such as cutouts (see also FIGS. 6a, 6b and 6c), and each layer has an array of pads 18. Referring also to FIGS. 6a–6c, the preferred array or configuration of pads 18 for each layer in accordance with the present invention is further illustrated.

FIG. 6a shows a typical bottom or base layer 12 having a first or centrally located array 20 of pads 18. As shown, this first array 20 includes a center pad 21 and a pattern of pads 18 surrounding center pad 21 which is approximately 3 deep or wide. Also as shown, traces 22 are provided leading from each pad 18 along the upper or contact surface 24 (see FIG. 2) of bottom layer 12, preferably to a test point via (not shown).

FIG. 6b is a top view of an intermediate layer 16 having an upper or contact surface 32 (see FIG. 2), a cutout 34 and an array 36 of pads 18 disposed around cutout 28. Referring back to FIG. 6a, cutout 34 is shown in dashed lines with respect to bottom layer 12 to further illustrate the positioning of intermediate layer 16 relative to bottom layer 12 such that cutout 34 is positioned over and exposing first array 20 as desired. Still referring to FIG. 6b, traces 22 are also provided leading away from each pad 18 of array 36 along upper surface 32 of intermediate layer 16, also preferably to test point vias as is known in the art. As shown, array 36 is preferably a band of pads 18 disposed around a periphery of cutout 34 and being generally three pads wide or deep. Of course, pads 18 could be provided in patterns of different width if desired, and could also be provided around only a portion of cutout 34, for example along only one or several edges, if desired.

FIG. 6c shows a top view of outer layer 14 having an upper or contact surface 26 (see FIG. 2), a cutout 28 and an array 30 of pads 18 disposed around cutout 28. Traces 22 are shown connected to each pad 18 of array 30, and also leading away to connection with test point vias (not shown) as desired. Referring to FIG. 6b cutout 28 is illustrated in dashed lines around array 36 of intermediate layer 16 so as to further illustrate the positioning of top layer 14 relative to intermediate layer 16. In addition, FIG. 6c shows in dashed lines an additional cutout 38 which would be formed in a further layer (not shown) positioned above outer layer 14, if desired.

From a consideration of FIGS. 2 and 6a–6c, it should readily be appreciated that layers 12, 14, 16 including cutouts and arrays of pads as discussed above serve, in combination, to define a mounting site 40 (FIG. 2) for an array surface mounted device.

Figure 3:
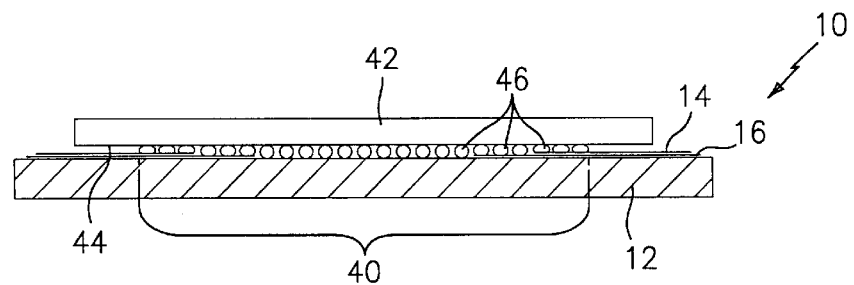
FIG. 3 is a side partially schematic view of a substrate structure and mounted device in accordance with the invention.

Referring back to FIG. 2, the multi-layer and cutout structure of the present invention defines a stair step cavity which has a portion of pads 18 defining mounting site 40 on each horizontal step surface. Although layers 14 and 16 are shown having exaggerated thickness in FIG. 2 for clarity, FIG. 3 illustrates substrate structure 10 having less exaggerated thickness and a typical array surface mounted device 42 mounted thereon. As shown, device 42 has a mounting surface 44 which is provided with a plurality or array of contact elements or solder balls 46. During assembly, device 42 of FIG. 3 is positioned over site 40 with balls 46 contacting pads 18 (FIG. 4), and heat and/or solder paste may be provided so as to form a good connection between balls 46 and pads 18 as desired. The stair step cavity of the multi-layer substrate 10 of the present invention advantageously serves to provide for excellent contact with each ball 46 of device 42 by virtue of the fact that each layer 12, 14 is provided having a total thickness which is sufficiently small that the total spacing or distance between contact surface 24 of base layer 12, and pads 18 disposed thereon, and contact surface 26 of outer layer 14, and pads 18 disposed thereon, is less than or equal to about 3 mils. This restriction on spacing allows for reliable contact between balls 46 of device 42 and pads 18 of substrate structure 10 despite the different heights or depths of pads 18 positioned in arrays 20, 30 and 36. This advantageously provides for etching or positioning of traces directly upon the layer 12, 14, 16 which bears the respective connected pad 18, thereby completely avoiding the need for vias positioned directly beneath mounting site 40. This structure further serves to help to reduce the total layer count needed for a particular substrate structure.

Figure 4:
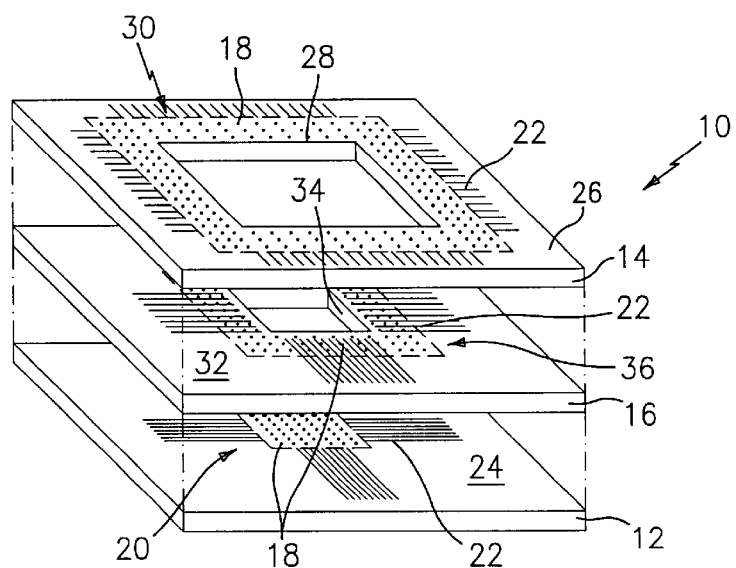
FIG. 4 is an exploded perspective view of a substrate structure in accordance with the present invention showing pads at various stair step levels for contacts with balls of a BGA package or device.

FIG. 4 further illustrates substrate structure 10 in accordance with the present invention, and shows base layer 12, an intermediate layer 16 and outer layer 14 in an exploded view to illustrate contact surfaces 24, 26 and 32 of each layer, as well as traces 22 connected to pads 18 thereon.

Figure 5:
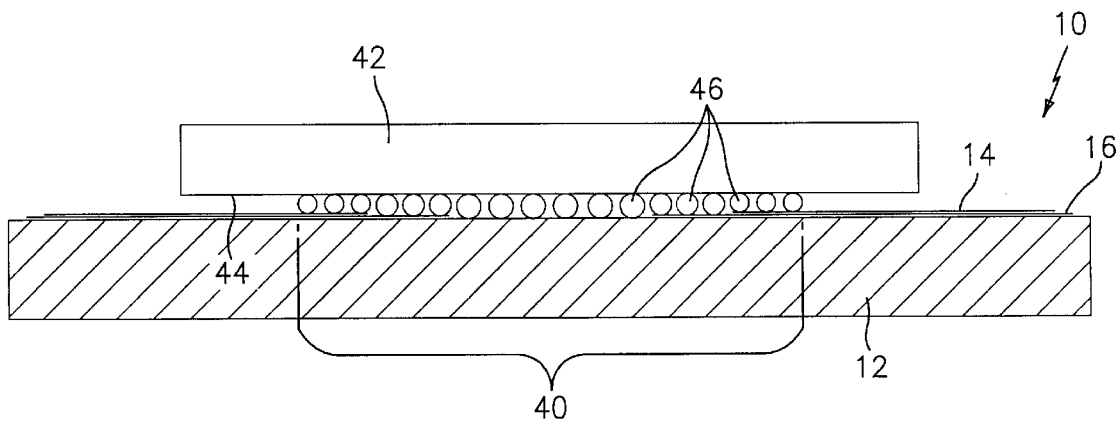
FIG. 5 is a side partially schematic view of an alternate embodiment of a substrate structure and mounted device in accordance with the present invention.

Referring now to FIG. 5, in accordance with an alternative embodiment of the present invention, device 42 may suitably be provided having balls 46 of different sizes so as to accommodate the slight difference in height of layers 12, 14 and 16. This feature is shown in exaggerated size so as to more clearly illustrate the features of the present invention. In accordance with this aspect of the present invention, balls 46 corresponding to first array 20 may be larger in size than balls 46 corresponding to array 36, which would in turn be larger in size than balls 46 corresponding to array 30. For example, the outermost three rows of balls 46 could be provided having a size or diameter of about 22 mils, while the next three peripheral rows of balls 46, corresponding to array 36, could be provided having a size or diameter of about 23 mils, and the innermost group of balls 46 corresponding to first array 20 could be provided having a size or diameter of about 25 mils. This combination of diameters of balls 46 would correspond acceptably with a configuration of substrate structure 10 as described wherein top or outer layer 14 and intermediate layer 16 each have a thickness of less than or equal to about 1 mil.

It should be noted that in this embodiment, layers 12, 14 and 16 in accordance with the present invention are suitably laminated together in substantially adjacent relationship, with each layer progressively spaced further from base layer 12 having a larger cutout to expose underlying arrays of other layers. These layers may be laminated together using conventional techniques which would be readily known to one of ordinary skill in the art. Furthermore, layers 12, 14 and 16 are preferably provided of a suitable dielectric material, also as is well known to one of ordinary skill in the art. It should also be noted that bottom or base layer 12 may suitably be any conventional PCB board, as the thickness of this layer does not impact upon the depth of the cavity defined by layers 14, 16. Thus, for example, base layer 12 could suitably be a conventional 62 mil PCB such as FR-4 or the like.

It should also be noted that although this and following disclosures are made in terms of a substrate structure 10 having two layers 14, 16 mounted above base layer 12, it would of course be possible, and well within the scope of the present invention, to provide a single top or outer layer mounted to base or core layer 12, or to provide additional layers mounted to base layer 12, provided that the thickness of each layer is sufficiently small that the transverse distance or vertical distance between pads 18 on base layer 12 and pads 18 on outer layer 14 is sufficiently small that contact with balls 46 of device 42 can readily be accomplished. In this regard, it should also be noted that many conventional devices or components 42 tend to warp upwards at the corners thereof, and the structure in accordance with the present invention has the inherent tendency to compensate for this warping, which is also advantageous.

Figure 7:
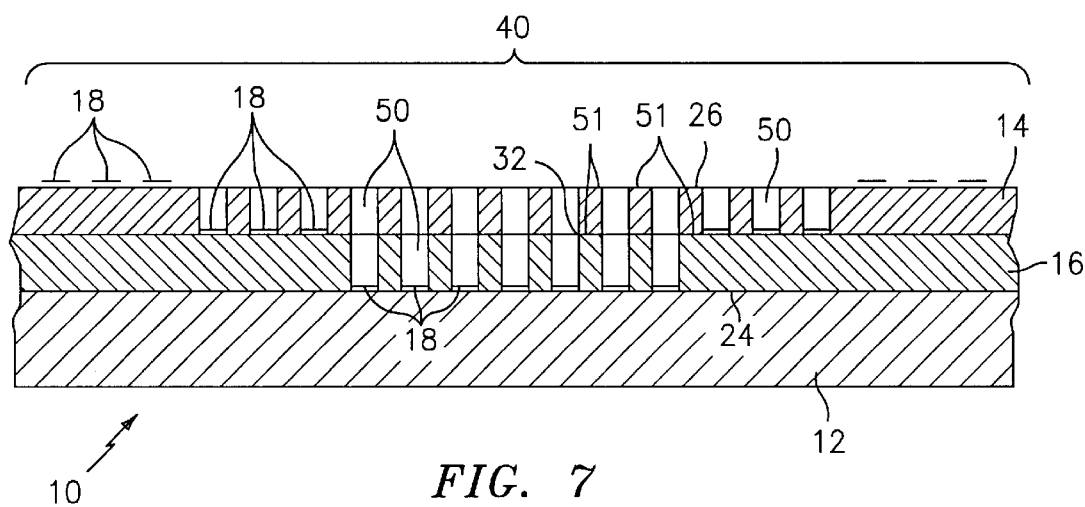
FIG. 7 is a side view of an additional embodiment of the present invention.

FIG. 7 illustrates a further embodiment of the present invention wherein access through outer layers is provided through clearance holes 50 aligned with pads 18 on the underlying layers, rather than an entire cutout as in the embodiment of FIGS. 2–6. FIG. 7 shows a three-layer embodiment of this structure wherein base layer 12 is still provided having a series of pads 18 on contact surface 24. In this embodiment, however, layers 14 and 16 are provided with holes 50 which pass through the thickness of layers 14, 16 and which are positioned so as to be aligned with pads 18 on underlying layers. As will be further discussed below, this embodiment provides all of the advantages of the embodiment of FIGS. 2–6, while further providing additional areas 51 on contact surfaces 26 and 32 which can advantageously be used for positioning traces and the like.

As shown in FIG. 7, layers 14 and 16 are advantageously provided with clearance holes 50 which are positioned to align with pads of lower layers and thereby allow contact of these pads with a device 42 when mounted to substrate structure 10. Thus, layer 14 is advantageously provided with holes 50 positioned to align with pads 18 on layer 16, and also with holes 50 positioned to align with pads 18 on layer 12. Similarly, intermediate layer 16 is provided with holes 50 aligned with pads 18 on underlying base layer 12. Of course, holes 50 pass through the entire thickness of layers 14 and 16 so as to provide the desired contact of underlying pads 18 with a device to be mounted on same.

Thus, in this embodiment of the present invention, clearance holes 50 provide access to lower pads, rather than the cutouts of the embodiment of FIGS. 2–6 as described above. Clearance holes 50 allow solder balls to go to two, three or more underlying layers of a multi-layer PC board. Each solder ball that a designer wishes to connect with a pad on outer layer 14 will simply mount on the mating pad 18 on this layer. Each solder ball that a designer wishes to connect with a pad on an intermediate layer 16 will pass through one clearance hole on outer layer 14 and connect with mounting pad 18 on intermediate layer 16. Further, each solder ball that a designer wishes to connect to base layer 12 will pass through clearance holes on both outer layer 14 and intermediate layer 16 and contact mating pad 18 on base layer 12. As with previous embodiments, layers 14, 16 are shown in the drawings with exaggerated thickness for illustration purposes. In actuality, layers 14, 16 are sufficiently thin that solder balls readily contact pads 18 through clearance holes 50 in two or more layers as desired.

FIGS. 8–13 further describe a particular device and a substrate structure 10 designed in accordance with this embodiment (FIG. 7) of the present invention.

Figure 8:
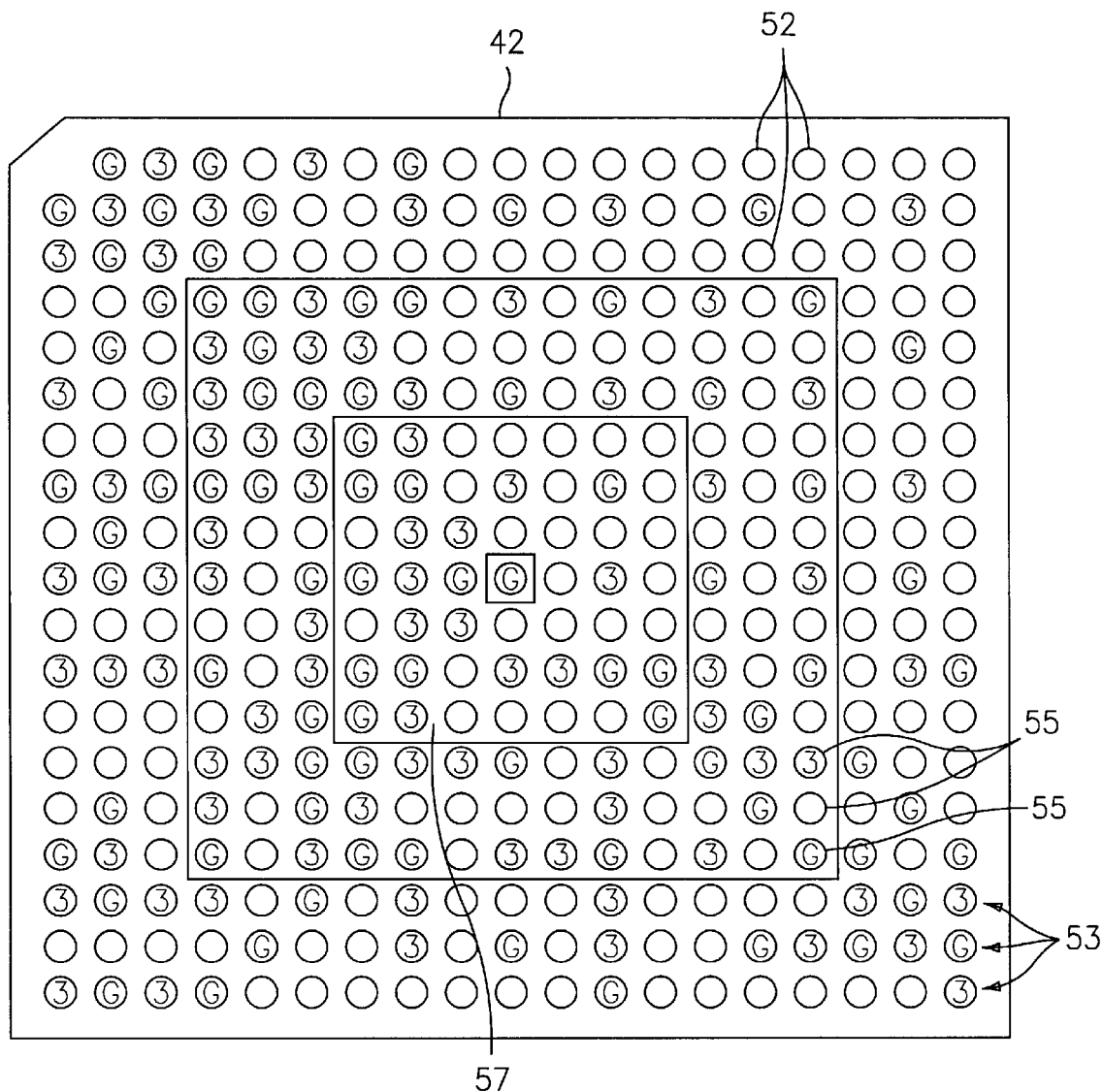
FIG. 8 is a view of a typical surface mount device showing the ball grid array as viewed through the device.

FIG. 8 shows the footprint of a typical device 42, in this case having a 360 ball grid array to be mounted to a substrate. This device is to be mounted using solder balls 52 which are intended to be connected to pads on substrate structure 10 in similar manner to the embodiments described above. For the purposes of this discussion, solder balls 52 are divided into three outer peripheral rows 53, three intermediate peripheral rows 55 and an inside block 57 or group of peripheral rows. For the sake of simplicity, rows of pads and/or clearance holes are discussed in connection with the present invention using the same reference numerals, 53, 55, 57, which correspond to the groups of solder balls 52 to which connection is intended. For the typical device footprint shown in FIG. 8, ground solder balls are identified by the letter G, and voltage solder balls are identified by the number 3. The remaining solder balls are signal solder balls for connection to provide various functionality. Thus, the device of this example has 82 ground solder balls, 81 voltage solder balls and 197 signal solder balls.

Figure 9:
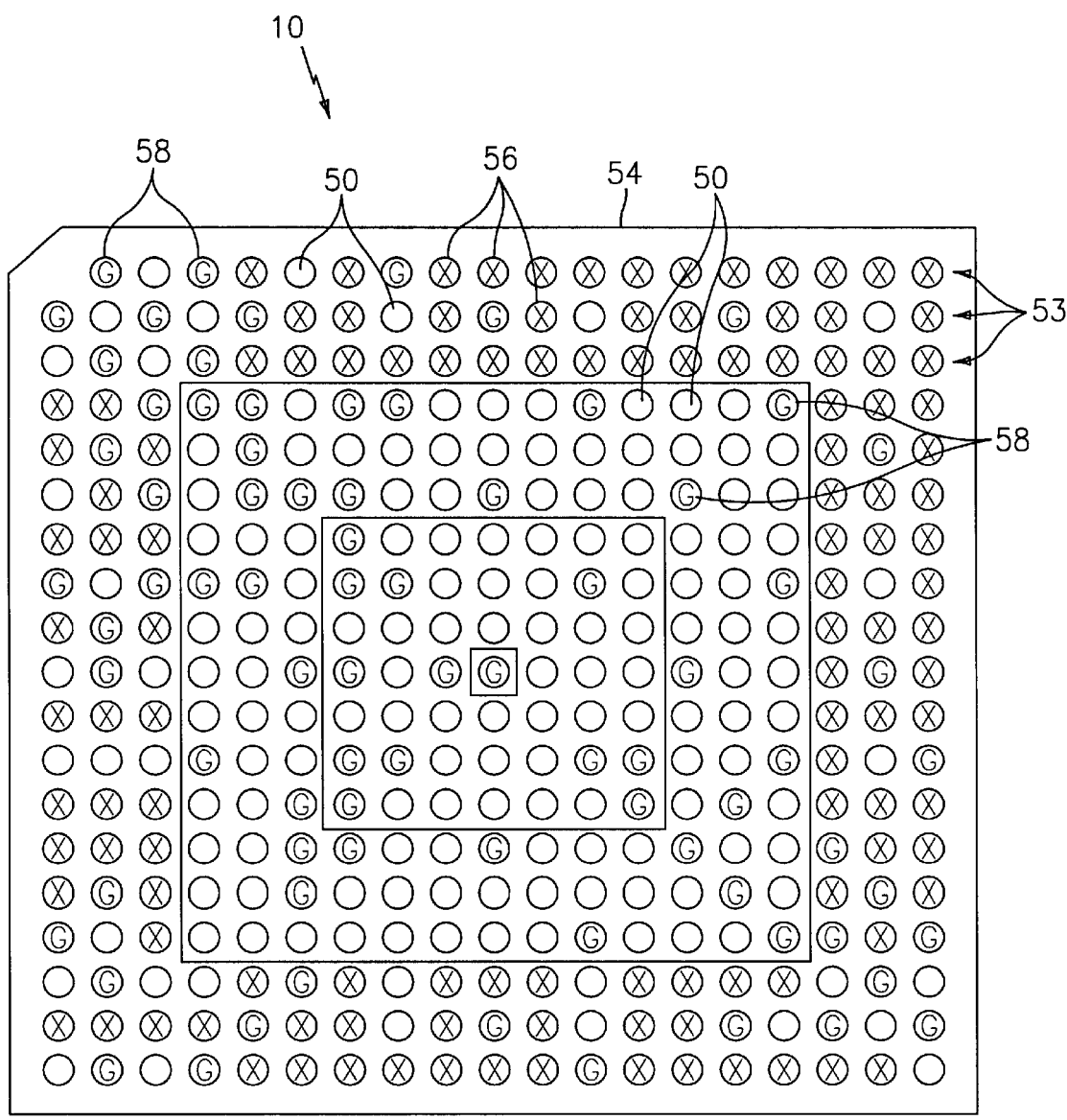
FIG. 9 is a top view of an outer layer in accordance with the embodiment of FIG. 7.

Turning to FIG. 9, an outer layer 54 of a three-layer mounting site 10 is illustrated. In this embodiment, outer layer 54 has pads 56 positioned to receive all signal solder balls that are located in the first three peripheral rows of the device (marked X). Outer layer 54 further has pads 58 (marked G) on which all ground solder balls of the device are to land. By positioning pads 58 for all ground solder balls on outer layer 54, layer 54 can then be defined as a ground plane as will be further discussed below.

Figure 10:
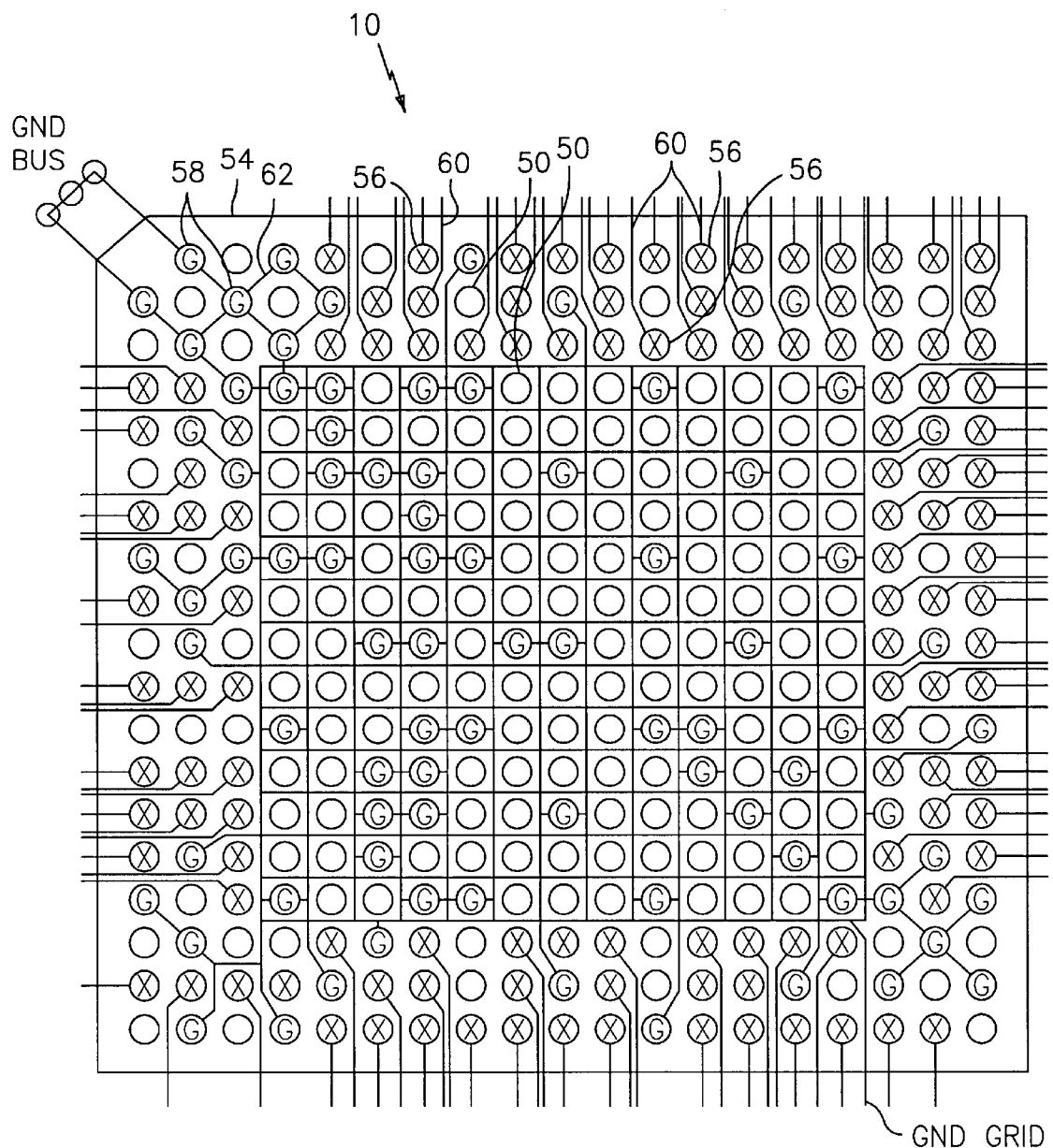
FIG. 10 is a top view showing tracing of the top layer of the embodiment of FIG. 7.

Turning now to FIG. 10, traces 60 are shown for each of signal pads 56 (also marked X), and traces 60 advantageously lead to outside of the footprint of the ball grid device. A ground plane grid 62 of traces is also positioned on layer 54 so as to attach all ground pads 58 (also marked G) and define the desired ground plane grid which is also routed outside of the footprint of the device, for example to connect to a ground bus.

The remaining blank circles illustrated in FIGS. 9 and 10 are clearance holes 50 which will allow solder balls 52 to connect with pads on underlying layers.

Figure 11:
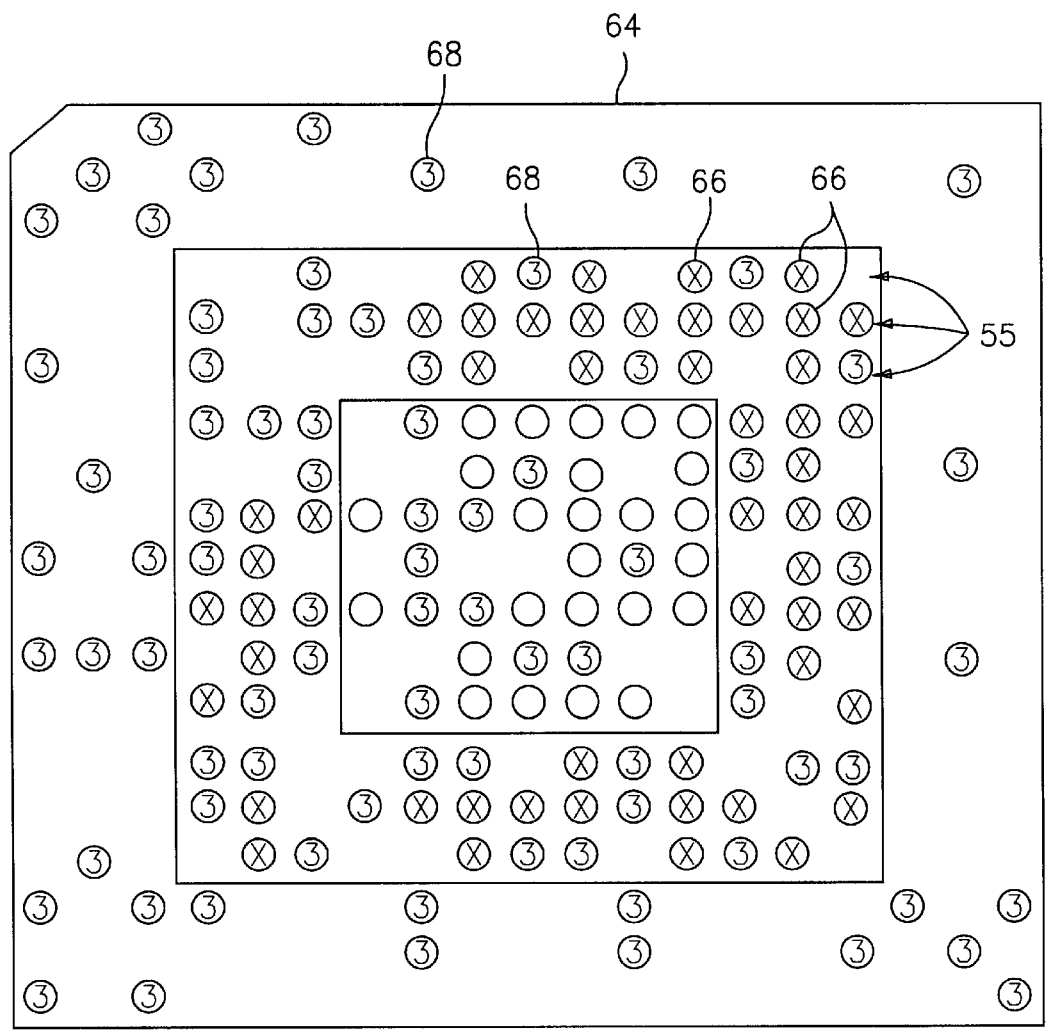
FIG. 11 is a top view showing an intermediate layer of the embodiment of FIG. 7.
Figure 12:
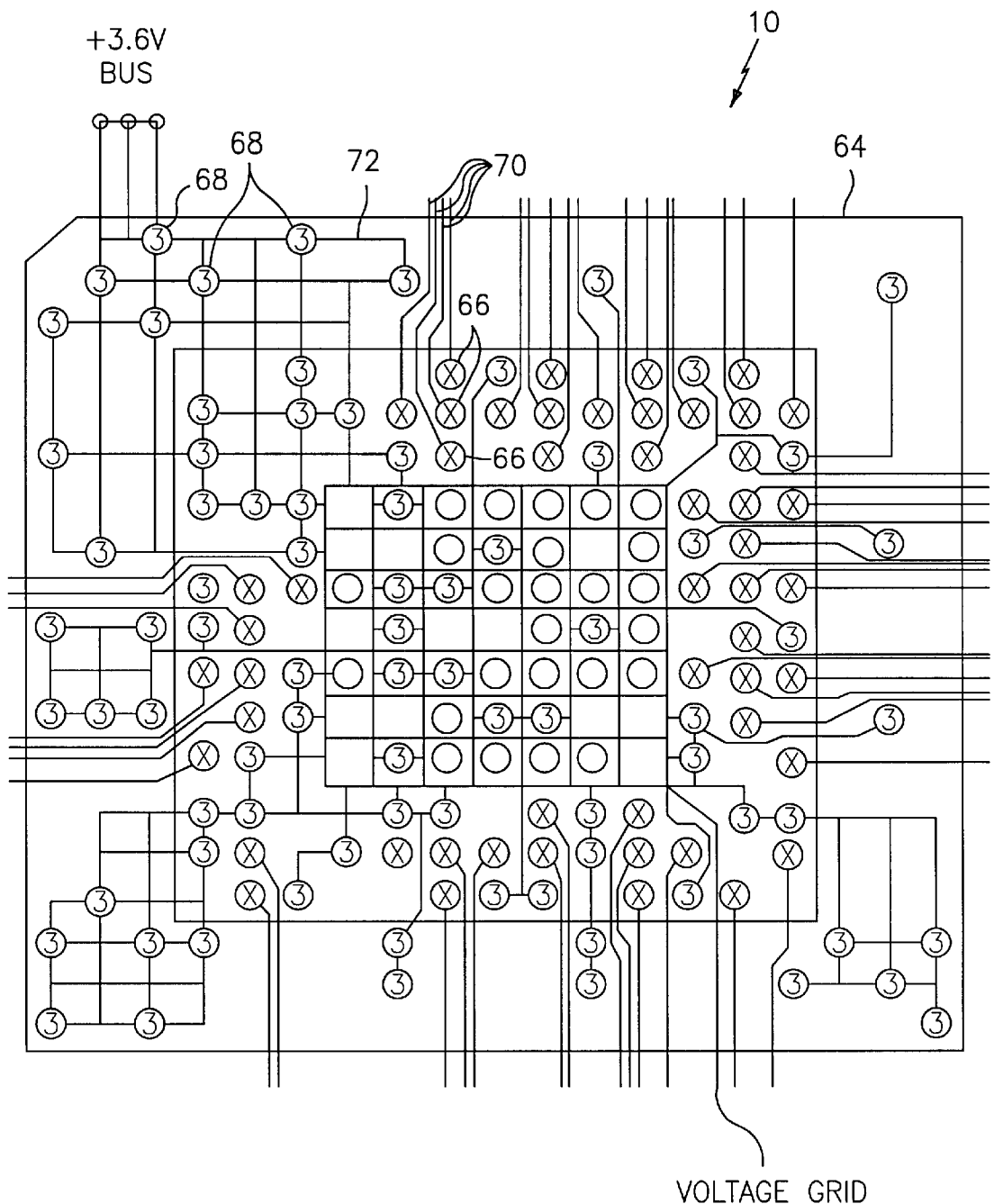
FIG. 12 is a top view showing tracing on the intermediate layer of the embodiment of FIG. 7.

FIG. 11 shows a top view of an intermediate layer 64 in accordance with this embodiment wherein all signal solder balls of the device which are located in the intermediate three peripheral rows 55 are designed to land on pads 66 (marked X), and further wherein all 3.6 voltage solder balls of the device are designed to land on voltage pads 68 (marked 3) so as to define a voltage plane on intermediate layer 64. Turning to FIG. 12, tracing for this layer is illustrated and shows all signal pads 66 routed with traces 70 to outside of the footprint of the ball grid device. FIG. 12 also shows traces defining a voltage plane grid 72 for connecting all voltage pads, and connection of voltage grid 72 typically to a voltage bus and the like.

Figure 13:
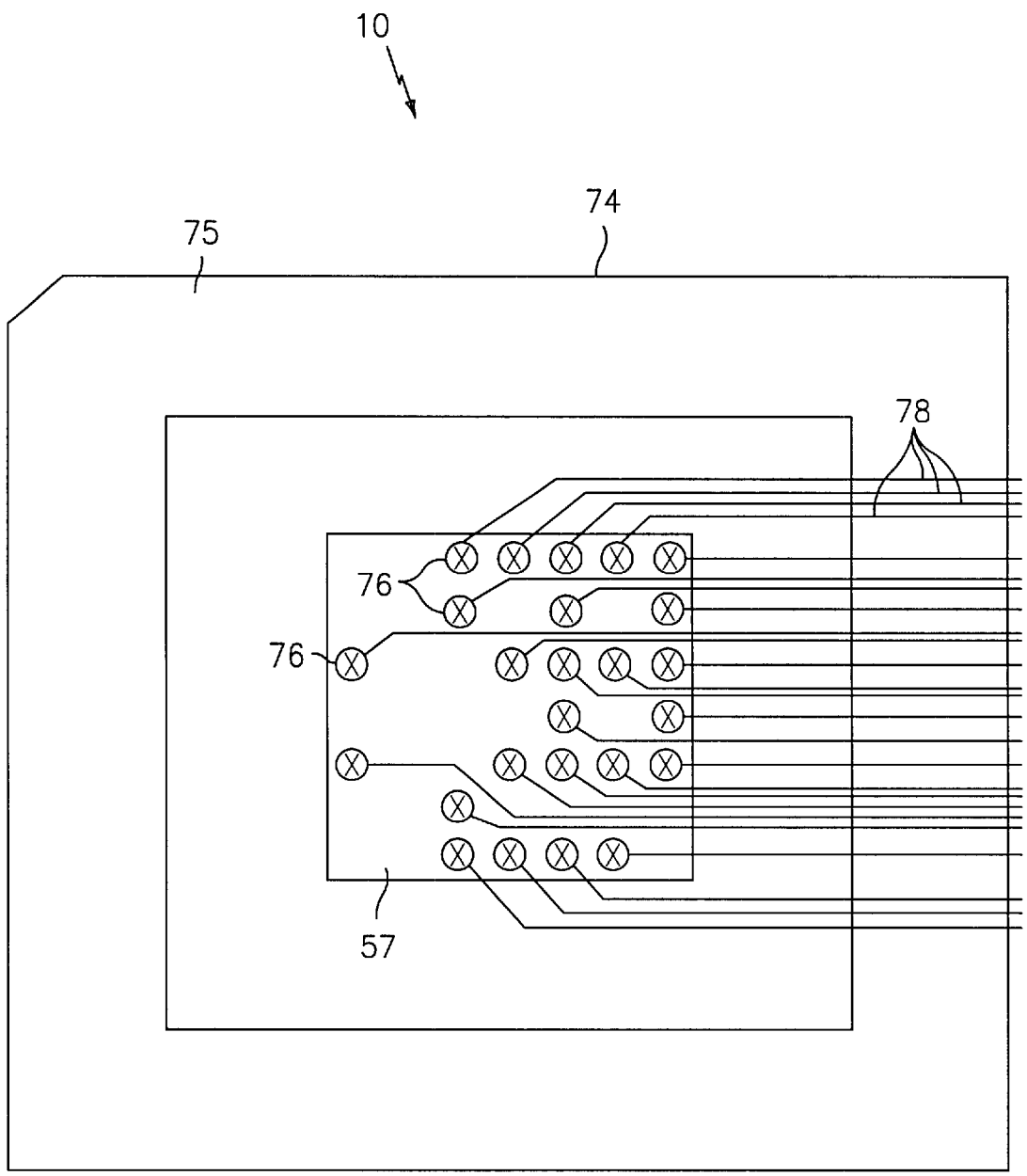
FIG. 13 is a top view showing the tracing on the base layer of the embodiment of FIG. 7.

FIG. 13 shows a top view of base layer 74 having signal pads 76 (marked X) for receiving all signal solder balls that are located inside the interior block 57 or three peripheral rows of the ball grid device. FIG. 13 further shows traces 78 for connecting signal pads 76 to outside of the footprint of the ball grid array device. In this example, it can be readily seen that a sizable area 75 is left unused on base layer 74. This area may advantageously be used for additional ground or voltage plane, if desired, or for any other board designing purpose.

As discussed below, it may be desirable to provide clearance holes 50 as clearance hole vias having conductive elements such as copper clad and the like such that traces could be routed to the location of a pad underlying the clearance hole via on any layer. This structure is described in more detail in connection with the embodiment of FIGS. 14–18 below and could readily be incorporated into the embodiment of FIGS. 7–13, if desired.

In the embodiment of FIGS. 7–13, it should readily be appreciated that solder balls for the ball grid array device will still fall on layers 54, 64 and 74 as they do in the embodiment of FIGS. 2–6, and vias are still not needed to run traces to outside of the ball grid array device. This design also therefore can advantageously be used to dramatically reduce the number of vias from underneath the device, thereby enhancing board reliability and allowing much needed space for ground or voltage grid planes. Further, all other surface mount components with one or more surface mount type leads can also fall on different layers of the substrate structure through clearance holes or clearance hole vias. During and at the completion of a PC board design layout, the designer can bring component leads down to the layers and/or traces to which connection with the component leads is desired, rather than bringing the traces up through outer layers using vias and the like. This, too, can serve to eliminate a substantial number of vias. The intermediate and outer layers which are provided with clearance holes 50 are sufficiently thin that the devices show no listing whatsoever.

A further advantage of this embodiment is that solder balls, which melt during completion of assembly, form pillars within the clearance holes which serve to give extra strength to the solder interface of the device. This design structure can in most cases eliminate entire layers of a conventional PC board, which represents a substantial improvement in the art.

Figure 14:
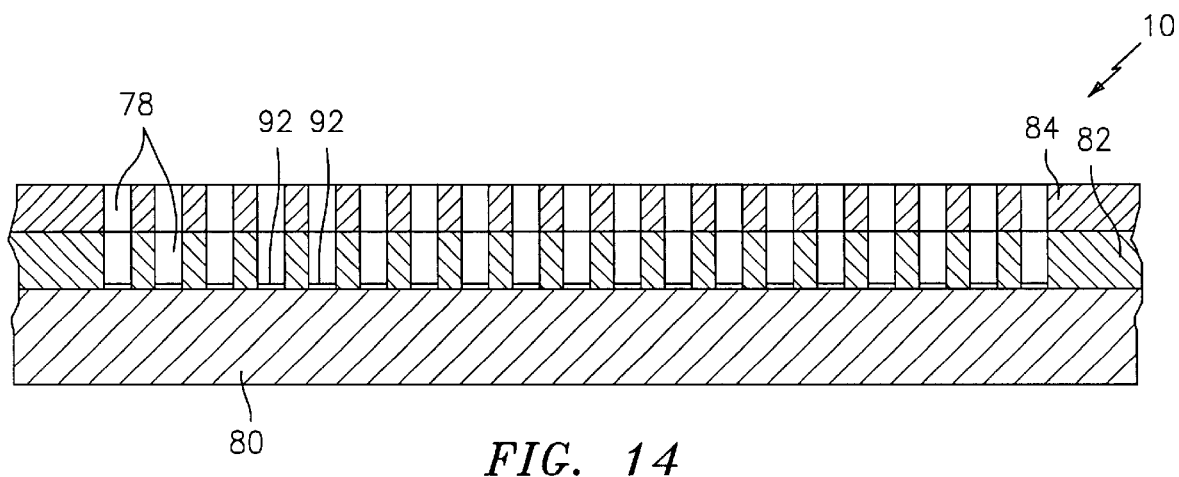
FIG. 14 is a side view of a further embodiment in accordance with the present invention.
Figure 15:
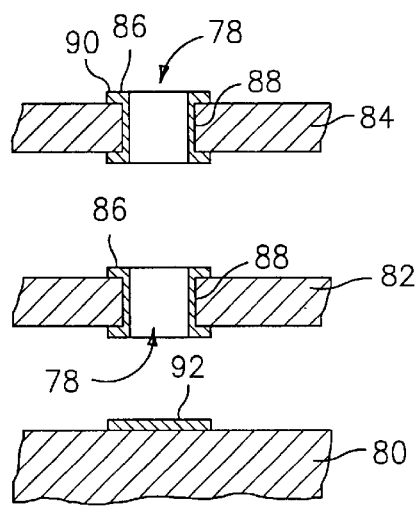
FIG. 15 is an exploded view of a portion of FIG. 14.

FIG. 14 illustrates a side sectional view of a further embodiment of the present invention wherein intermediate and outer layers are provided with clearance holed vias 78 corresponding to all solder balls of the ball grid device such that all solder balls will land on a base layer 80. In this embodiment, each clearance hole via 78 is preferably provided having copper clad or other conductive material on the clearance hole walls which serve to define conductive elements that can be connected to along desired layers. FIG. 15 shows an enlarged and exploded view of a section of substrate structure 10 showing base layer 80, an intermediate layer 82 and an outer layer 84. As shown in FIG. 15, clearance hole vias 78 on layers 82 and 84 are provided with conductive elements 86, which in this case are illustrated as a typical copper clad structure having conductive material positioned along walls 88 of vias 78 and extending in a ring 90 around the perimeter of via 78. Routing of traces can be similar to that described in the embodiment of FIGS. 7–13, and would connect to rings 90 of conductive elements 86 for the desired layers.

An additional benefit provided by this invention is that clearance hole vias 78 serve to provide further integrity of solder connections through layers 82 and 84 to pads 92 on base layer 80. The copper clad on walls 88 provides for continuity down to pads 92 on base layer 80. When solder balls melt during assembly, there is contact to conductive elements 86 on layers 82 and 84, as well as to pads 92 on base layer 80 which allows a trace to be connected to a particular pad or element on any desired layer.

Clearance hole vias such as those illustrated in FIG. 15 could also advantageously be incorporated into the embodiment of FIGS. 7–13, if desired, with similar benefits to tracing versatility and enhanced joint strength.

The solder connections extending through vias 78 increase the height of the solder column which forms the solder ball joint, and thereby increases the reliability of the joint. Thus, in this embodiment, in addition to reducing board layer count and board costs as discussed above, an additional improvement in solder joint reliability is provided.

Utilizing the example of a ball grid device as illustrated in FIG. 8, the design of a substrate structure in accordance with this embodiment of the invention will now be illustrated.

Figure 16:
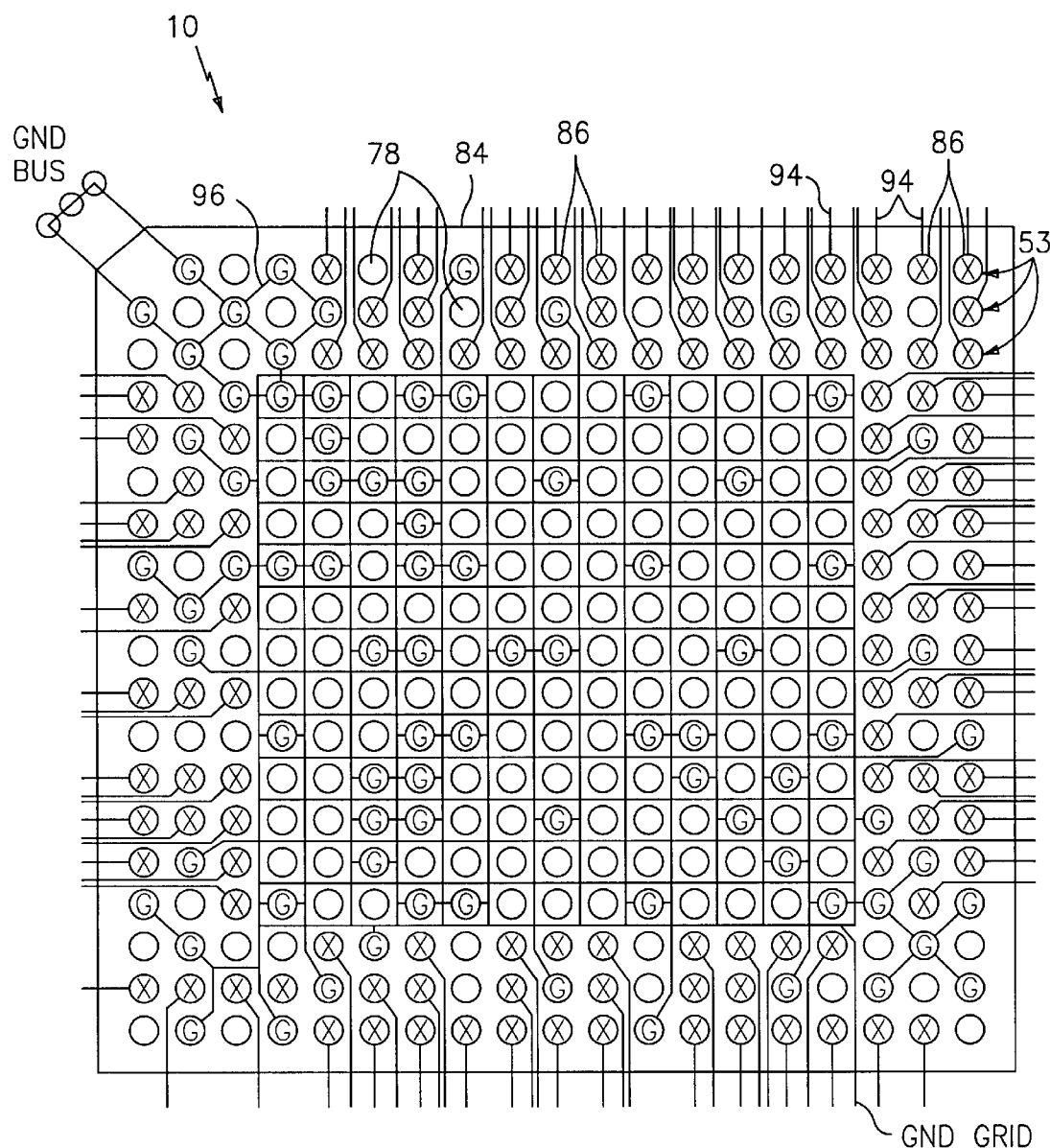
FIG. 16 is a top view of the outer layer of the embodiment of FIG. 14.

FIG. 16 shows outer layer 84 having traces 94 connected to conductive elements 86 corresponding to signal balls (marked X) of the device in the first three peripheral rows 53. Traces 94 are drawn outwardly so as to extend beyond the footprint of the ball grid device. As in the embodiment of FIGS. 8–13, outer layer 84 is also utilized to define a ground plane grid 96 which is connected to conductive elements 86 corresponding to ground solder balls (marked G) of the device and preferably extending outside the footprint of the device for connection to a ground bus.

Figure 17:
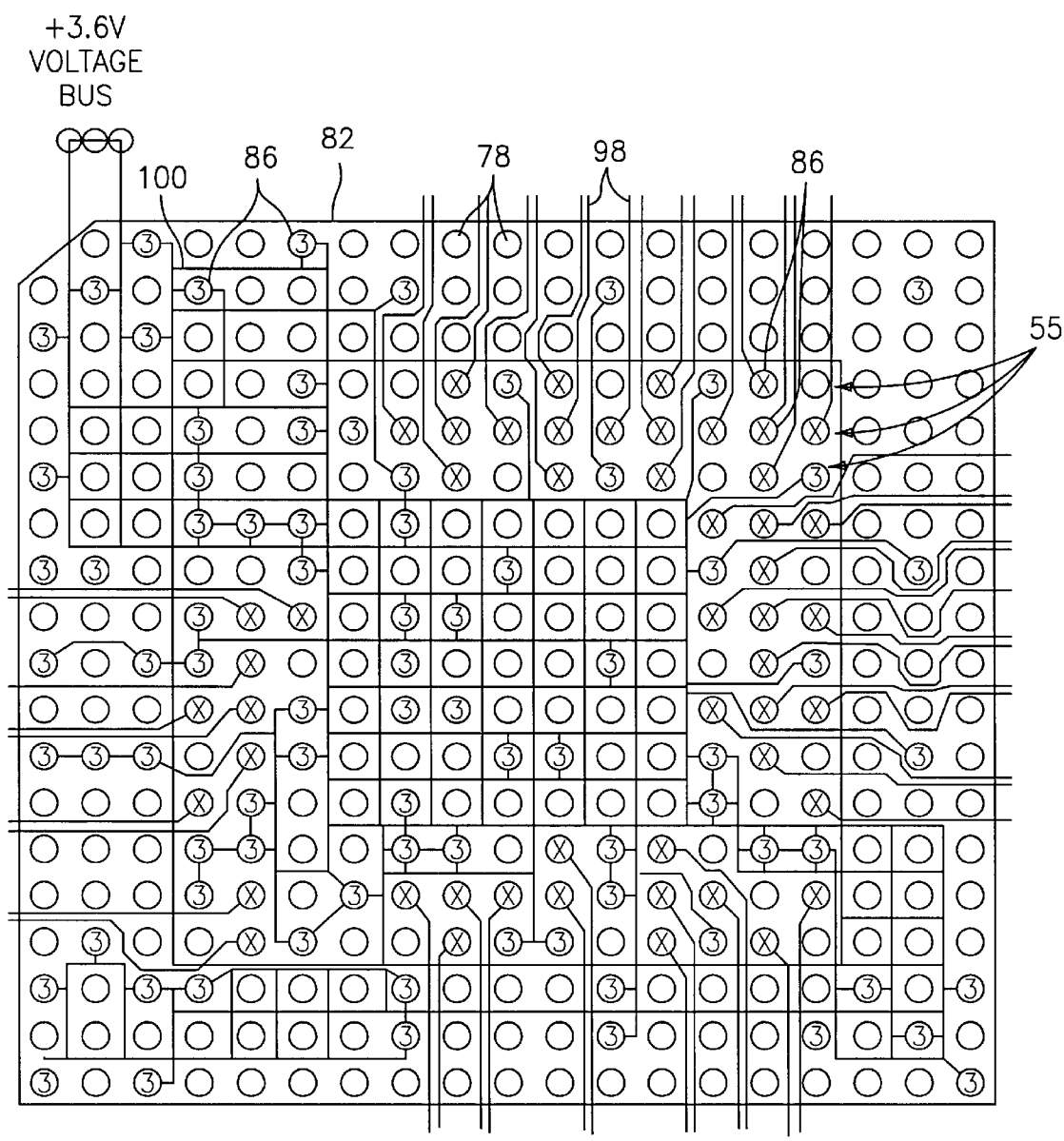
FIG. 17 is a top view of the intermediate layer of the embodiment of FIG. 14.

FIG. 17 illustrates a top view of intermediate layer 82 and traces 98 which are connected to conductive elements 86 on intermediate layer 82 (marked X) which correspond to signal balls of the intermediate three peripheral rows 55 of the ball grid device. Traces 98 are preferably drawn outside the footprint of the ball grid device for connection as desired. In addition, a voltage grid 100 is defined by connecting to conductive elements 86 which correspond to all voltage balls of the ball grid device (marked 3), and voltage grid 100 preferably extends outwardly for connection with a voltage bus outside the perimeter of the device.

Figure 18:
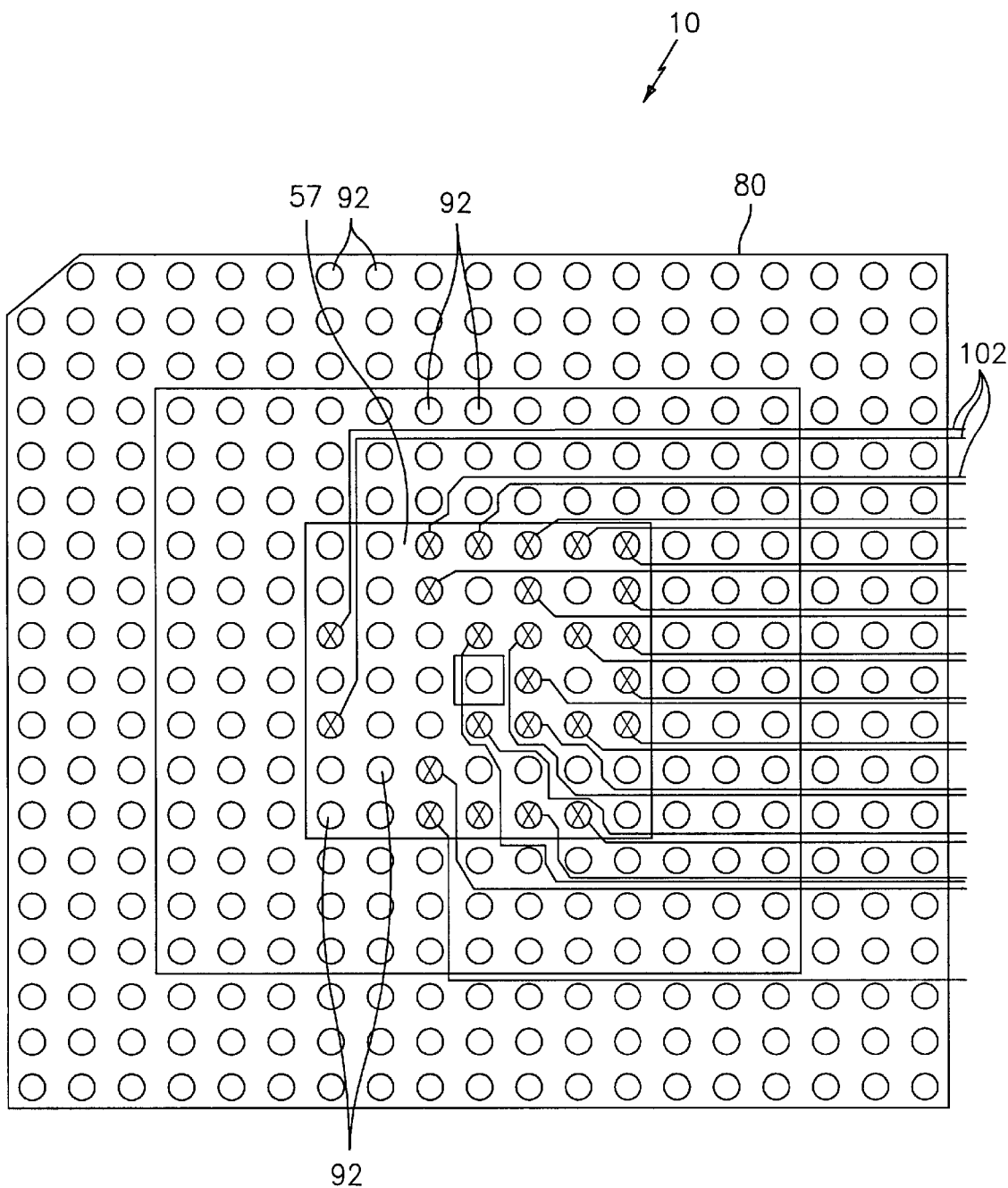
FIG. 18 is a top view of the bottom layer of the embodiment of FIG. 14.

FIG. 18 shows a top view of base layer 80 having pads 92 for connection to all solder balls of the ball grid device. In addition, traces 102 are connected to pads 92 which correspond to remaining signal solder balls of the device, in this embodiment those located within the inside block or perimeter 57 of the device, and traces 102 are drawn outside of the footprint of the device for connection as desired.

In addition to advantages provided by the embodiments of FIGS. 2–6 and 7–13, this particular embodiment provides the additional benefit of interchangeability of intermediate and outer layers. Thus, manufacturing is greatly simplified. This interchangeability can advantageously be used for further creative routing, as well. For example, if the routing pattern of intermediate layer 82 and base layer 80 of the embodiment illustrated in FIGS. 16–18 were interchanged, then the layer with the fewest traces would be positioned in the middle of the device, and clever designing could advantageously position these traces on the base layer so as to thereby avoid the need for an intermediate layer whatsoever. In other words, the interchangeability of layers could allow the tracing patterns of FIGS. 17 and 18 to be combined on a single base layer.

It should be pointed out that in this particular embodiment of the present invention, consideration must be given to proper selection of clearance hole sizes and solder ball pads to conform to good design practices such as those set forth in IPC-BM-7-782A. For example, when using solder balls having a diameter of approximately 0.025 inches or 25 mils, the clearance holes in intermediate and outer layers can be smaller than the solder ball diameter. Since half the height of a solder ball in this example is 0.0125 inches or 12.5 mils, it is acceptable to use 3, 4 or 5 mil total thickness for the outer and intermediate layers. The diameter of the solder ball in such a configuration would not prevent the ball from resting on pads on the base layer, and as identified above, when the solder ball melts, it forms an excellent bond within the clearance hole vias into the solder ball pads on the base layer.

In such a configuration, the holes on intermediate and outer layers could for example be between about 13 mils and about 23 mils in diameter. The distance between edges of pads, as well as trace technology and recommended spacing between traces will then determine how many traces can be routed between two adjacent pads or conductive elements. In the example set forth above, pads are used having a 27 mils diameter which leaves approximately 23 mils in spacing between annular rings of the conductive elements. Thus, traces can be utilized having a width of between about 4 and about 5 mils, with three spaces alternated between traces and conductive elements, with the outside spaces being 4 mils in width and the middle space being approximately 5 mils in width.

It should be readily apparent that substrate structure 10 in accordance with the present invention advantageously provides a mounting site 40 for a wide variety of different devices or components, such as multi-chip modules, BGAs, CSPs, flip chips and the like. Furthermore, substrate structure 10 in accordance with the present invention could readily be used for mounting chips within packages as well as for mounting packages to substrates, and would provide similar advantages in this environment. Array surface mounted devices such as those discussed above and chips themselves to be mounted within packages are referred to collectively herein as surface mount devices.

It should also readily be appreciated that although certain components of substrate structure 10 of the present invention are referred to with respect to vertical orientation, such as bottom layer 12, top layer 14 and upper surfaces 24, 26 and 32, substrate structure 10 in accordance with the present invention could of course be provided in an inverted orientation. In this orientation, the stair step cavity defined by cutouts 28, 34 faces downward, and base layer 12 has layers 16, 14 positioned on its bottom or secondary surface. Of course, in this configuration, traces 22 and pads 18 would be positioned on contact surfaces 24, 26 and 32 facing downwardly. Thus, nothing in this disclosure should be construed as limiting the scope of the invention to any particular orientation of substrate structure 10. Further, as set forth above, substrate structure 10 may suitably be provided on primary or secondary sides of a base layer or PCB, or both, all well within the scope of the present invention.

Finally, it should also be readily apparent that the substrate structure 10 in accordance with the present invention advantageously provides for elimination or at least substantial reduction in the number of vias which must be positioned below device 42 on mounting site 40. This significantly reduces the cost of substrate structure 10, and further completely eliminates an entire source of reliability problems. Furthermore, substrate structure 10 in accordance with the present invention serves to reduce the total number of layers which are required, thereby also providing for a reduction in cost. Alternatively, the structure of the present invention could be used in connection with several dielectric layers to allow the use of wider traces between pads, which in some applications could also provide for a reduction in cost.

It is to be understood that the invention is not limited to the illustrations described and shown herein, which are deemed to be merely illustrative of the best modes of carrying out the invention, and which are susceptible of modification of form, size, arrangement of parts and details of operation. The invention rather is intended to encompass all such modifications which are within its spirit and scope as defined by the claims.

What is claimed is:

1. A substrate structure for surface mount devices, comprising:
    a plurality of substrate layers including at least a base layer and an outer layer;
    said base layer having a contact surface and a first array of conductive elements on said contact surface;
    said outer layer having a contact surface, a second array of conductive elements on said contact surface, and at least one access passing through said outer layer; and
    said outer layer being mounted to said base layer with said access positioned over said first array, wherein said first array and said second array define in combination a device mounting site, and further comprising at least one intermediate layer disposed between said base layer and said outer layer and having a contact surface, an access passing through said intermediate layer, and a third array of conductive elements, said access of said intermediate layer being positioned over said first array of conductive elements and said access of said outer layer being positioned over said first array of conductive elements and said third array of conductive elements whereby said first, second and third arrays define in combination said device mounting site.

2. A substrate structure according to claim 1, wherein said access is a cutout, and wherein said conductive elements are conductive pads.

3. A substrate structure according to claim 2, wherein said first array and said second array are spaced in a direction substantially perpendicular with respect to said layers of less than or equal to about 3 mils.

4. A substrate structure according to claim 2, further comprising a first plurality of traces connected to said first array of conductive pads and extending along said contact surface of said base layer, and a second plurality of traces connected to said second array of conductive pads and extending along said contact surface of said outer layer.

5. A substrate structure according to claim 2, further comprising at least one intermediate layer between said outer layer and said base layer, and wherein said outer layer and said at least one intermediate layer in combination have a thickness of less than or equal to about 3 mils.

6. A substrate structure according to claim 2, wherein each of said at least one intermediate layer and said outer layer has a thickness of less than or equal to about 1 mil.

7. A substrate structure according to claim 2, wherein said plurality of substrate layers are layers of dielectric material.

8. A substrate structure according to claim 2, wherein said outer layer and said at least one intermediate layer are layers of dielectric material.

9. A substrate structure according to claim 2, wherein said second array of conductive pads is disposed in an array positioned along at least a portion of said cutout.

10. A substrate structure according to claim 9, wherein said array is less than or equal to about 3 pads in width whereby traces for each pad of said second array can be positioned on said contact surface of said outer layer.

11. A substrate structure according to claim 1, wherein said access comprises a plurality of holes positioned on said outer layer and aligned with said first array of conductive elements on said base layer.

12. A substrate structure according to claim 11, wherein said plurality of holes of said outer layer pass through said outer layer and are defined by an inwardly facing circular wall, and wherein said second array of conductive elements comprises a conductive material disposed on said wall and extending onto said contact surface of said outer layer.

13. A substrate structure according to claim 11, further comprising a device mounted to said device mounting site and contacting said first array of conductive elements and said second array of conductive elements.

14. A substrate structure according to claim 1, further comprising at least one of a voltage grid and a ground plane grid disposed on one of said plurality of substrate layers.

15. A substrate structure for surface mount devices, comprising:
    a base layer having a contact surface and a first array of conductive elements on said contact surface; and
    at least one additional layer each having a contact surface, an access and a further array of conductive elements on said contact surface, said at least one additional layer being positioned substantially adjacent to said base layer such that said first array and said further array of each additional layer define in combination a device mounting site, wherein said at least one additional layer comprises a plurality of layers stacked adjacent to said base layer, and wherein said access of each additional layer positioned sequentially away from said base layer is at least as large as said further array of a preceding layer of said plurality of layers.

16. A substrate structure according to claim 15, wherein said access is a cutout, and wherein said conductive elements are conductive pads.

17. A substrate structure according to claim 16, wherein said at least one additional layer comprises a plurality of layers stacked adjacent to said base layer, and wherein said cutout of each additional layer positioned sequentially away from said base layer is at least as large as said further array of a preceding layer of said plurality of layers.

18. A substrate structure according to claim 15, further comprising a first plurality of conductive traces connected to said first array of conductive pads and disposed along said contact surface of said base layer, and a second plurality of conductive traces connected to said further array of conductive pads and disposed along said contact surface of each layer of said at least one additional layer.

19. A substrate structure according to claim 15, wherein said access comprises a plurality of holes positioned on said at least one additional layer and aligned with said first array of conductive elements on said base layer.

20. A substrate structure according to claim 19, wherein said plurality of holes of said at least one additional layer pass through said at least one additional layer and are defined by an inwardly facing circular wall, and wherein said further array of conductive elements comprises a conductive material disposed on said wall and extending onto said contact surface of said at least one additional layer.

21. A substrate according to claim 19, further comprising a device mounted to said device mounting site and contacting said first array of conductive elements and said further array of conductive elements.

22. A substrate structure according to claim 15, further comprising at least one of a voltage grid and a ground plane grid disposed on one of said base layer and said plurality of layers.

23. A printed circuit structure, comprising:
a surface mount device having a mounting surface and a plurality of conductive members disposed on said mounting surface; and
a substrate structure for mounting said device, comprising a plurality of substrate layers including at least a base layer and an outer layer; said base layer having a contact surface and a first array of conductive elements on said contact surface; said outer layer having a contact surface, an access and a second array of conductive elements on said contact surface; and said outer layer being mounted relative to said base layer with said access positioned over said first array, said first array and said second array defining in combination a device mounting site; and
further comprising at least one intermediate layer disposed between said base layer and said outer layer and having a contact surface, an access passing through said intermediate layer, and a third array of conductive elements, said access of said intermediate layer being positioned over said first array of conductive elements and said access of said outer layer being positioned over said first array of conductive elements and said third array of conductive elements whereby said first, second and third arrays define in combination said device mounting site;
said surface mount device being connected to said mounting site with said conductive members connected to said first array, said second array and said third array.

24. A printed circuit structure according to claim 23, wherein said access is a cutout, and wherein said conductive elements are conductive pads.

25. A printed circuit structure according to claim 23, wherein said device is mounted to said substrate overlapping at least a portion of said base layer and said outer layer.

26. a printed circuit structure according to claim 23, wherein said conductive members are substantially the same in size.

27. A printed circuit structure according to claim 23, wherein said conductive members include a first group of members arranged to contact said first array, and a second group of members arranged to contact said second array, and wherein members of said first group are larger in size than members of said second group.

28. A printed circuit structure according to claim 23, wherein said access comprises a plurality of holes positioned on said outer layer and aligned with said first array of conductive elements on said base layer.

29. A printed circuit structure according to claim 28, wherein said plurality of holes of said outer layer pass through said outer layer and are defined by an inwardly facing circular wall, and wherein said second array of conductive elements comprises a conductive material disposed on said wall and extending onto said contact surface of said outer layer.

30. A printed circuit structure according to claim 23, further comprising at least one of a voltage grid and a ground plane grid disposed on one of said plurality of substrate layers.

31. A substrate structure for surface mount devices, comprising:
a plurality of substrate layers including at least a base layer and an outer layer;
said base layer having a contact surface and a first array of conductive elements on said contact surface;
said outer layer having a contact surface, a second array of conductive elements on said contact surface, and at least one access passing through said outer layer; and
said outer layer being mounted to said base layer with said access positioned over said first array, wherein said access comprises a plurality of holes positioned on said outer layer and aligned with said first array of conductive elements on said base layer, and further comprising at least one intermediate layer disposed between said base layer and said outer layer and having a contact surface, a plurality of holes, and a third array of conductive elements, said plurality of holes of said intermediate layer being positioned over said first array of conductive elements and said plurality of holes of said outer layer being positioned over said first array of conductive elements and said third array of conductive elements whereby said first, second and third arrays of conductive elements define, in combination, said device mounting site.

32. A substrate structure for surface mount devices, comprising:
a base layer having a contact surface and a first array of conductive elements on said contact surface;
at least one additional layer each having a contact surface, an access and a further array of conductive elements on said contact surface, said at least one additional layer being positioned substantially adjacent to said base layer such that said first array and said further array of each additional layer define in combination a device mounting site;

wherein said access comprises a plurality of holes positioned on said at least one additional layer and aligned with said first array of conductive elements on said base layer; and wherein said at least one additional layer comprises at least two additional layers disposed on said base layer and each having a contact surface, a plurality of holes, and a further array of conductive elements, said plurality of holes of each of said at least two additional layers being positioned over said first array of conductive elements, whereby said first array and said further arrays of conductive elements define, in combination, said device mounting site.

33. A printed circuit structure, comprising:

a surface mount device having a mounting surface and a plurality of conductive members disposed on said mounting surface; and a substrate structure for mounting said device, comprising a plurality of substrate layers including at least a base layer and an outer layer; said base layer having a contact surface and a first array of conductive elements on said contact surface; said outer layer having a contact surface, an access and a second array of conductive elements on said contact surface; and said outer layer being mounted relative to said base layer with said access positioned over said first array, wherein said access comprises a plurality of holes positioned on said outer layer and aligned with said first array of conductive elements on said base layer; and said substrate structure further comprising at least one intermediate layer disposed between said base layer and said outer layer and having a contact surface, a plurality of holes, and a third array of conductive elements, said plurality of holes of said intermediate layer being positioned over said first array of conductive elements, and said plurality of holes of said outer layer being positioned over said first array of conductive elements and said third array of conductive elements, whereby said first, second and third arrays of conductive elements define, in combination, a device mounting site, said surface mount device being connected to said device mounting site with said conductive members connected to said first array, said second array and said third array of conductive elements.

* * * * *